United States Patent [19]

Iwahashi

[11] Patent Number: 4,982,364

[45] Date of Patent: Jan. 1, 1991

[54] SEMICONDUCTOR MEMORY HAVING A STABALIZED REFERENCE POTENTIAL FOR USE IN DETECTING A DATA READ OUT FROM A MEMORY CELL

[75] Inventor: Hiroshi Iwahashi, Yokohama, Japan

[73] Assignee: Kabushiki Kaisha Toshiba, Kawasaki, Japan

[21] Appl. No.: 298,154

[22] Filed: Jan. 17, 1989

[30] Foreign Application Priority Data

Jan. 18, 1988 [JP] Japan .................................. 63-7945

[51] Int. Cl.[5] ......................... G11C 7/00; G11C 7/02; G11C 11/34
[52] U.S. Cl. ............................... 365/189.09; 365/210; 365/185
[58] Field of Search ................... 365/189.09, 210, 185, 365/230.06; 307/469

[56] References Cited

U.S. PATENT DOCUMENTS

| | | | |
|---|---|---|---|
| 4,094,008 | 6/1978 | Lockwood et al. | 365/149 |
| 4,272,834 | 6/1981 | Noguchi et al. | 365/189.09 |
| 4,333,168 | 6/1982 | Mashiko et al. | 365/210 |
| 4,340,943 | 7/1982 | Asano et al. | 365/210 |
| 4,371,956 | 2/1983 | Maeda et al. | 365/210 |
| 4,644,501 | 2/1987 | Nagasawa | 365/210 |
| 4,692,904 | 9/1987 | Sato et al. | 365/189.09 |
| 4,819,212 | 4/1989 | Nakai et al. | 365/210 |

Primary Examiner—Stuart N. Hecker
Assistant Examiner—Michael A. Whitfield
Attorney, Agent, or Firm—Finnegan, Henderson, Farabow, Garrett and Dunner

[57] ABSTRACT

A semiconductor memory device comprises first and second dummy memory cells. The first dummy memory cell is connected between a normal row line and a dummy column line. The second dummy memory cell is connected to a dummy row line and the dummy column line. The dummy row line is applied with an output voltage of a bias circuit which applies a constant voltage. The second dummy memory cell is used as a reference memory cell and generates a reference potential which is kept unchanged.

27 Claims, 9 Drawing Sheets

SEMICONDUCTOR MEMORY HAVING A STABALIZED REFERENCE POTENTIAL FOR USE IN DETECTING A DATA READ OUT FROM A MEMORY CELL

BACKGROUND OF THE INVENTION

1. Field of the Invention

This invention relates to a semiconductor memory device and, more particularly, to the stabilization of a reference potential for use in detecting a data read out from a memory cell.

2. Description of the Related Art

Figure 1:
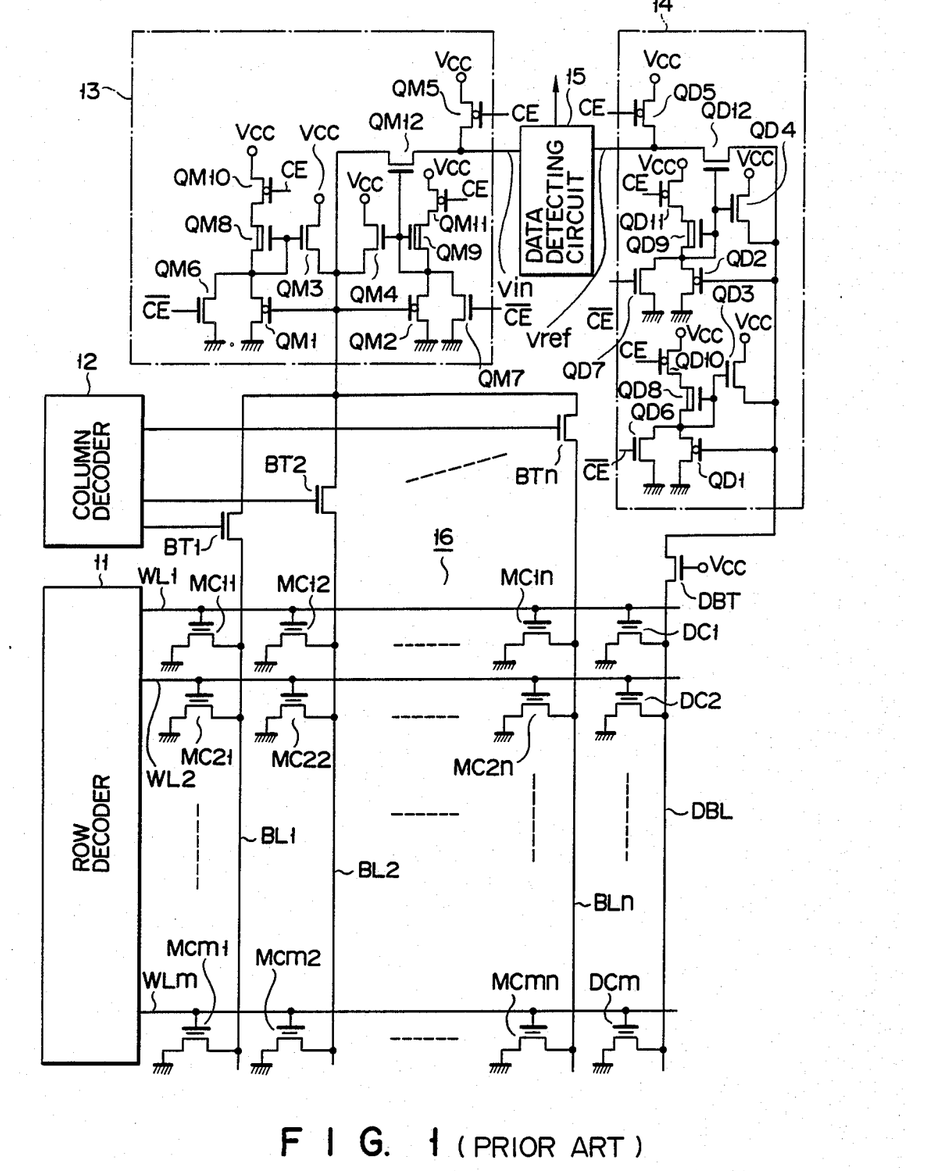
FIG. 1 shows a circuit diagram of a conventional semiconductor device.

A conventional EPROM (erasable and programmable read only memory) is shown in FIG. 1. MC11, MC12 ..., MC1n, ..., MCmn designate memory cells comprised of floating gate MOSFETs (metal oxide semiconductor field effect transistors). DC1, DC2, ..., DCm designate dummy memory cells comprised of floating gate MOSFETs. WL1, WL2, ... WLm are row lines. BL1, BL2, ..., BLn are normal column lines. DBL designates a dummy column line.

Reference numerals 11 and 12 denote a row decoder and a column decoder, respectively. BT1, BT2, ..., BTn denote column gate MOSFETs for selecting one of column lines BL1, BL2, ..., BLn, respectively. DBT designates a MOSFET corresponding to the column gate MOSFET for dummy column line DBL. MOSFET DBT is substantially identical to column gate MOSFET BT (a general designation of BT1, BT2, ..., BTn). The gate of MOSFET DBT is supplied with a power source voltage so that MOSFET DBT is normally turned conductive. First load circuit 13 comprises MOSFETs QM1 to QM12 and generates a potential Vin. Second load circuit 14 comprises MOSFETS QD1 to QD12 and generates a reference potential Vref. Data detecting circuit 15 comprises a sense amplifier.

In the EPROM as shown in FIG. 1, data detecting circuit 15 compares reference potential Vref with potential Vin. Reference potential Vref is generated by second load circuit 14, based on the data read out from a selected dummy memory cell DC (a general designation of DC1, DC2, ..., DCm). Potential Vin is generated by first load circuit 13, based on the data read out from a selected normal memory cell MC (a general designation of MC11, MC12, ..., MC1n, ..., MCmn). Through the comparison, the data stored in the selected, normal memory cell MC is detected.

The MOSFET of a dummy memory cell DC is substantially identical to the MOSFET of a normal memory cell MC. Dummy column line DBL is substantially identical to a normal column line BL (a general designation of BL1, BL2, ..., BLn).

The current supply ability of the load MOSFET QD5 in second load circuit 14 is larger than that of load MOSFET QM5 in first load circuit 13 to provide a potential difference between the potentials Vref and Vin, so that data can be detected. If the current supply abilities of the first and second load circuits are the same, data can not be detected. Specifically, in the memory cells of such an EPROM, electrons are injected into the floating gate of a memory cell to write data "0" thereinto. On the other hand, electrons are not injected in the floating gate of a memory cell to write data "1" thereinto. A memory cell in which electrons are injected is kept off, even when a logic "1" signal is applied to the control gate. On the other hand, a memory cell in which electrons are not injected is turned on, when a logic "1" signal is applied to the control gate. No electrons are injected into the dummy memory cell. Therefore, the logic state of the dummy memory cell is substantially the same as that of a normal memory cell in which electrons are not injected. If the current supply ability of the MOSFET QD5 is equal to that of the MOSFET QM5, no difference occurs between potentials Vref and Vin. In this case, data can not be detected. In order to detect data, it is necessary to provide a difference between potentials Vref and Vin. This is the reason why the current supply ability of the MOSFET QD5 is larger than that of the MOSFET QM5. The current supply ability difference causes a potential difference between potential Vref and Vin, even when a normal memory cell in which electrons are not injected is selected.

The current supply ability difference can be obtained by using the different channel widths of the load MOSFETs in first and second load circuits 13 and 14. Assume, for example, the channel width of MOSFET QM5 is denoted by W5, its channel length by L, the channel width of MOSFET QD5 by W6, and its channel length by L. In this case W6 > W5. so that a current supply ability difference can be obtained between the load MOSFETs QD5 and QM5.

When the MOSFET QM1, QM2, QM3, and QM4 in first load circuit 13 are sized to be W1/L, W2/L, W3/L and W4/L, respectively, then the MOSFET QD1, QD2, QD3, and QD4 in second load circuit 14 are also designed to have the size of W1/L, W2/L, W3/L and W4/L, respectively. Further, W1 > W2 and W3 > W4. And, MOSFETs QM8, QM9, QD8, and QD9 have the same size.

In the above memory device arrangement, to generate reference potential Vref, dummy memory cell DC is connected to row line WL (a general designation of WL1, WL2, ... WLn), dummy column line DBL is connected to dummy memory cell DC, and dummy column line DBL is connected to second load circuit 14. This circuit arrangement can provide reference potential Vref stable against the power source noise. The reason for this is that dummy column line DBL is substantially identical to normal column line BL and, thus, the stray capacitances of the dummy column line and the normal column line are substantially equal to each other. Because of the capacitances being equal, the potential variation on column line BL and dummy column line DBL are substantially equal, even when the power source potential varies. Consequently, data detecting circuit 15 can perform a correct data detection.

In such EPROM, since, however, dummy cells DC are connected to row lines WL, reference potential Vref varies during the transient period of a switching of the row lines.

Figure 2:
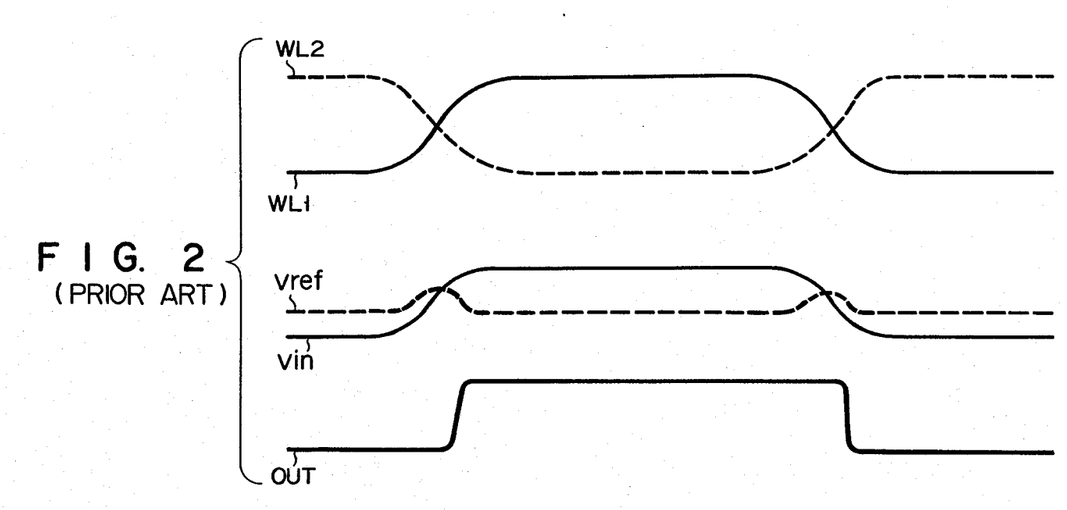
FIG. 2 shows waveforms of signals at varies portions of the semiconductor memory device shown in FIG. 1.

FIG. 2 shows waveforms of signals at varies portions in the conventional memory device shown in FIG. 1. When a logic state of row line WL2 changes from "1" to "0", and, at the same time, a logic state of row line WL1 changes from "0" to "1", potential Vin becomes a logic "1", and data detecting circuit 15 outputs a logic "1". During the transient period of this row line switching, no row lines are selected. In this transient period, the row line WL2 to be discharged to a logic "0" and the row line WL1 to be charged to a logic "1" are both at medium potential between a logic "1" and a logic "0". In the nonvolatile semiconductor memory cells of floating gate MOSFETs, the threshold voltage of the memory cell is generally high, e.g., 2 V. So, the sum of the currents flowing through dummy memory cell DC2 and dummy memory cell DC1 when the row lines WL1 and WL2 are at the medium potential is smaller than that of the current flowing through one dummy memory cell when the row line is perfectly in a logic "1". As a result, as shown in FIG. 2, reference potential Vref rises when in the transient period of the row line switching.

When the potential difference between potentials Vref and Vin is larger, the data detection is easier, and the data detection time of data detecting circuit 15 is shortened. When, on the other hand, the potential difference is smaller, the data detection is more sensitive to noise so that data detecting circuit 15 may perform an erroneous operation.

In the conventional memory device of the type using a dummy column line, during the transient period of the row lines (during the logic level of potential Vin changes), potential Vref varies and approaches to potential Vin, so that the difference between these potential Vref and Vin becomes smaller. If, therefore, noise occurs during this transient period, data detecting circuit 15 will possibly perform an erroneous data detection.

SUMMARY OF THE INVENTION

Accordingly, an object of this invention is to provide a semiconductor memory device, in which data detecting operation is stable against the noise occurring during the transient period of the row line switching.

To achieve the above object, there is provided a semiconductor memory device comprising:
a row decoder;
a column decoder;
normal row line one of the normal row lines being enabled in at least a data-read mode, which is selected by said row decoder;
normal memory cells driven by the normal row lines;
normal column lines for receiving the data read out from the memory cells;
a first load circuit connected to the normal column lines, for generating a potential corresponding to the data read out to the memory cell;
a dummy row line;
means for applying a bias potential to the dummy row line in at least the data-read mode to enable the dummy row line;
a dummy column line;
first dummy memory cells each comprised of a MOSFET whose drain is connected to the dummy column line a path connecting the drain and the source of, the MOSFET forming an opened circuit; and
a second dummy memory cell comprised of a MOSFET whose drain and gate are connected to the dummy column line and the dummy row line, respectively, the MOSFET being turned on when the bias potential is applied to the conductive line.

In the semiconductor memory device according to this invention, the second dummy memory cell is used as a reference memory cell and is not controlled by the normal row line. The second dummy memory cell is controlled by the dummy row line. The dummy row line is applied with the output voltage of a bias circuit which applies a constant voltage. This feature enables the reference potential output of the second load circuit to be kept unchanged.

DETAILED DESCRIPTION OF THE PREFERRED EMBODIMENTS

An embodiment of this invention will be described with reference to the accompanying drawings.

Figure 3:
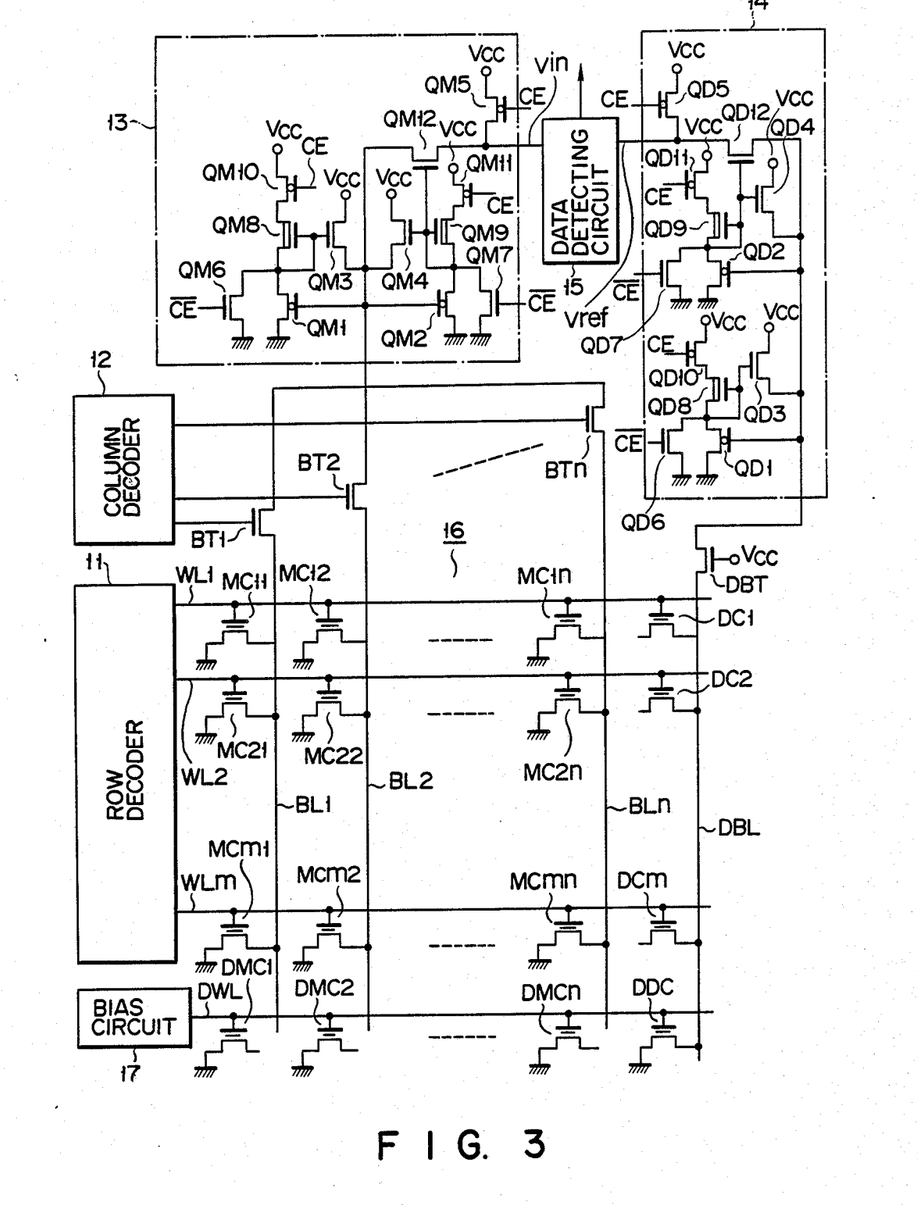
FIG. 3 shows a circuit diagram of a semiconductor memory device according to an embodiment of this invention.

FIG. 3 shows a semiconductor memory device according to an embodiment of the present invention. The memory device is an EPROM in which memory cells are constituted of floating gate MOSFETs.

In FIG. 3, MC11, MC12, ..., MC1n, ..., MCmn designate normal memory cells comprised of floating gate MOSFETs. DC1, DC2, ..., DCm designate dummy memory cells (first dummy memory cells) comprised of floating gate MOSFETs. Dummy memory cells DC1, DC2, .., DCm are substantially identical to normal memory cell MC (a general designation of MC11, MC12, ..., MCmn). DDC designates a dummy memory cell (second dummy memory cell) comprised of a floating gate MOSFET. Dummy memory cell DDC is substantially identical to normal memory cell MC. WL1, WL2, ..., WLm are normal row lines. BL1, BL2, ..., BLn are normal column lines. DBL is a dummy column line. Reference numerals 11 and 12 denote a row decoder and a column decoder, respectively. BT1, BT2, BTn are column gate MOSFETs for selecting one of column lines BL1, BL2, ..., BLn, respectively. DBT designates a MOSFET corresponding to the column gate MOSFET for dummy column line DBL. The MOSFET DBT is substantially identical to the column gate MOSFET BT (a general designation of BT1, BT2, ..., BTn). The gate of MOSFET DBT is supplied with a power source voltage Vcc, so that MOSFET DBT is normally turned conductive. Dummy memory cell DDC is substantially identical to normal memory cells MC1, MC12, ..., MCmn.

First load circuit 13 comprises MOSFETs QM1 to QM12 and generates a potential Vin. Second load circuit 14 comprises MOSFETs QD1 to QD12 and generates a reference potential Vref.

Data detecting circuit 15 includes a sense amplifier.

DWL is a dummy word line. DMC1, DMC2, ..., DMCn are dummy memory cells (third dummy memory cells) comprised of floating gate type MOSFETs. Dummy memory cell DMC (a general designation of DMC1, DMC2, ..., DMCn) are substantially identical to normal memory cell MC. A bias circuit is denoted by reference numeral 17.

Normal row lines WL1, WL2, ..., WLm are connected to row decoder 11, and are energized by the output signal of the row decoder. Dummy row line DWL is connected to bias circuit 17, and is energized by an output signal of the bias circuit. The gates of normal memory cells MC11, MC12, ..., MC1n are connected to normal row line WL1. The gates of normal memory cells MC21, MC22, MC2n are connected to normal row line WL2. The gates of normal memory cells MCm1, MCm2, ..., MCmn are connected to normal row line WLm. The drains of the memory cells MC11, MC12, ..., MC1n are connected to column lines BL1, BL2, ..., BLn, respectively. The drains of the memory cells MC21, MC22, ..., MC2n are connected to column lines BL1, BL2, ..., BLn, respectively. The drains of the memory cells MCm1, MCm2, ..., MCmn are connected to column lines BL1, BL2, ..., BLn, respectively. The source of memory cell MC is connected to ground. Column gates MOSFETs BT1, BT2, ..., BTn are inserted between column lines BL1, BL2, ..., BLn and load circuit 13. The gates of these MOSFETs are connected to column decoder 12 and are controlled by the output signal of the column decoder.

A path connecting the drain and the source of each of dummy memory cells DC1, DC2, ..., DCm is an opened circuit. The control gates of the dummy memory cells DC1, DC2, ..., DCm are connected to normal row lines WL1, WL2, ..., WLm, respectively. The drain regions of these cells are connected to dummy column line DBL. The drain region of the dummy memory cell DDC is connected to dummy column line DBL, and its source is connected to ground. The control gate of dummy memory cell DDC is connected to dummy row line DWL. The drain regions of dummy memory cells DMC1, DMC2, ..., DMCn are floating in potential, and their source regions are grounded. The control gates of dummy memory cells DMC1, DMC2, ..., DMCn are connected to dummy row line DWL.

First load circuit 13 comprises MOSFETs QM1 to QM12. QM8 and QM9 are depletion type MOSFETs, and other MOSFETs are enhancement type MOSFETs. MOSFETs QM1, QM2, QM5, QM10, and QM11 have zero threshold voltage.

MOSFETs QM10, QM8, and QM1 are connected in series between power source potential Vcc and the ground. MOSFET QM6 is connected in parallel to MOSFET QM1. MOSFET QM3 is connected between power source potential Vcc and normal bit line BL. The gates of MOSFETs QM8 and QM3 are connected to the interconnection of MOSFETs QM8, QM6, and QM1. MOSFETs QM11, QM9, and QM2 are connected in series between power source potential Vcc and the ground. MOSFET QM7 is connected in parallel to MOSFET QM2. MOSFET QM4 is connected between power source potential Vcc and normal bit line BL. The gates of MOSFETs QM9 and QM4 are connected to the interconnection of MOSFETs QM9, QM7, and QM2. The gates of MOSFETs QM1 and QM2 are connected to normal bit line BL.

MOSFET QM12 is connected between normal bit line BL and data detecting circuit 15. The gate of MOSFET QM12 is connected to the interconnection of MOSFETs QM9, QM7, and QM2.

MOSFET QM5 is connected between power source potential Vcc and data detecting circuit 15.

The gate of MOSFETs QM5, QM10, and QM11 are supplied with chip enable signal CE. The gates of MOSFETs QM6 and QM7 are supplied with inverted chip enable signal $\overline{CE}$.

Second load circuit 14 comprises MOSFETs QD1 to QD12. QD8 and QD9 are depletion type MOSFETs, and other MOSFETs are enhancement type MOSFETs. MOSFETs QD1, QD2, QD5, QD10, and QD11 have zero threshold voltage.

MOSFETs QD10, QD8, and QD1 are connected in series between power source potential Vcc and the ground. MOSFET QD6 is connected in parallel to MOSFET QD1. MOSFET QD3 is connected between power source potential Vcc and dummy bit line DBL. The gates of MOSFETs QD8 and QD3 are connected to the interconnection of MOSFETS QD8, QD6, and QD1. MOSFETs QD11, QD9, and QD2 are connected in series between power source potential Vcc and the ground. MOSFET QD is connected in parallel to MOSFET QD2. MOSFET QD4 is connected between power source potential Vcc and normal bit line BL. The gates of MOSFETs QD9 and QD4 ar connected to the interconnection of MOSFETs QD9, QD7, and QD2. The gates of MOSFETs QD1 and QD2 are connected to dummy bit line DBL.

MOSFET QD12 is connected between dummy bit line DBL and data detecting circuit 15. The gate of MOSFET QD12 is connected to the interconnection of MOSFETs QD9, QD7, and QD2.

MOSFET QD5 is connected between power source potential Vcc and data detecting circuit 15.

The gate of MOSFETs QD5, QD10, and QD11 are supplied with chip enable signal CE. The gates of MOSFETs QD6 and QD7 are supplied with inverted chip enable signal $\overline{CE}$.

Bias circuit 17 generates a bias potential substantially equal to the potential of a selected row line. First and second load circuits 13 and 14 are designed as in those of the conventional memory device shown in FIG. 1. Data detecting circuit 15 detects the data on the basis of the output potentials Vin and Vref of first and second load circuits 13 and 14.

The stray capacitance of dummy column line DBL of the memory device thus constructed is substantially equal to that of dummy column line DBL of the conventional memory device of FIG. 1, since MOSFET DDC is only added in the memory device of this embodiment. Dummy row line DWL is connected to the control gates of the MOSFETs of DMC1, DMC2, ..., DMCn, and DDC. The stray capacitance of the dummy row line DWL is equal to that of each normal row line WL, since the same number of MOSFETs are connected to normal row line WL and dummy row line DWL.

Dummy memory cell DDC comprises a MOSFET substantially identical to that of normal memory cell MC. Dummy column line DBL is substantially identical to the normal column line BL. The current supply ability of the load transistor QD5 in the second load circuit 14 is larger than that of the load transistor QM5 in the first load circuit 13. The difference between the current supply abilities causes a difference between the potential Vref and the potential Vin output from first load circuit 13 and second load circuit 14, respectively. The current supply ability difference can be realized, as in the conventional case, by selecting the channel widths W5 and W6 of transistors QM5 and QD5, respectively, so that W6>W5. When the sizes of MOSFETs QM1, QM2, QM3, and QM4 in first load circuit 13 are selected so as to satisfy W1/L, W2/L, W3/L, and W4/L, respectively, then the sizes of MOSFETs QD1, QD2, QD3, and QD4 in second load circuit 14 are selected so as to satisfy W1/L, W2/L, W3/L and W4/L, respectively. Furthermore, W1>W2 and W3>W4. And, MOSFETs QM8, QM9, QD8 and QD9 have the same size.

In the EPROM thus arranged, reference potential Vref is generated by second load circuit 14 on the basis of the data of dummy memory cell DDC. The potential Vin is generated in first load circuit 13 on the basis of the data which is stored in the selected normal memory cell MC. Potentials Vref and Vin are compared by data detecting circuit 15. Through the comparison, data detecting circuit 15 detects the data of normal memory cell MC.

Figure 4:
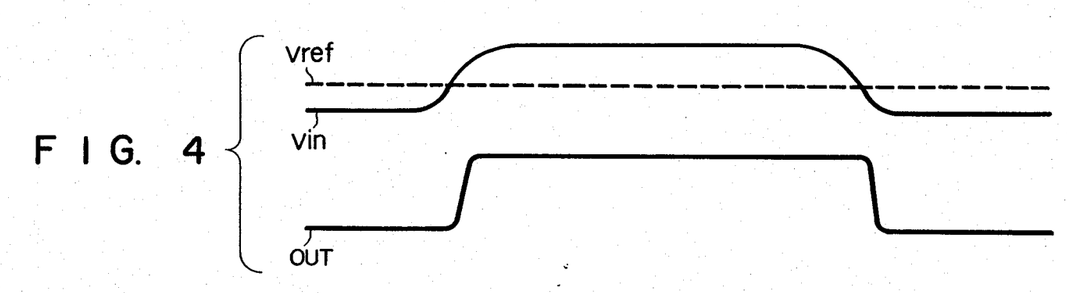
FIG. 4 shows waveforms of signals at varies portions of the semiconductor memory device shown in FIG. 3.

It is noted that a fixed potential is normally applied to dummy row line DWL from bias circuit 17. As a result, the reference potential Vref does not vary, even when the row lines are in the switching period. The reference potential Vref generated by second load circuit 14 is kept unchanged, as shown in the waveform diagram of FIG. 4. Therefore, even in the transient period during which the logic level of the row lines changes, potential Vref does not approach to potential Vin. So, even if noise occurs in the device in the transient period, data detecting circuit 15 will correctly detect data.

Bias circuit 17 is, preferably, substantially identical to row decoder 11. In this case, selected normal row line WL and dummy row line DWL are equally effected by noise, so that the erroneous operation of the memory device due to noise is suppressed.

FIGS. 5A to 5D show circuit diagrams of bias circuits suitable for use in the memory device shown in FIG. 3.

Figure 5A:
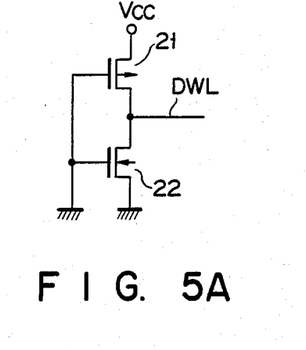
FIGS. 5A to 5D show varies circuit diagrams of a bias circuit used in the semiconductor memory device of FIG. 3.

A bias circuit of FIG. 5A has a circuit arrangement substantially equivalent to the buffer circuit (not shown) in row decoder 11 (FIG. 3). The bias circuit comprises P channel MOSFET 21 and N channel MOSFET 22. The gates of these transistors are connected to ground. The source-drain paths of these transistors are connected in series between power source potential Vcc and ground potential. The interjunction of MOSFETs 21 and 22 is connected to dummy word line DWL. In this circuit arrangement, P channel MOSFET 21 is normally conductive, while N channel MOSFET 22 is normally nonconductive. Dummy row line DWL is set to the power source potential via MOSFET 21.

Figure 5B:
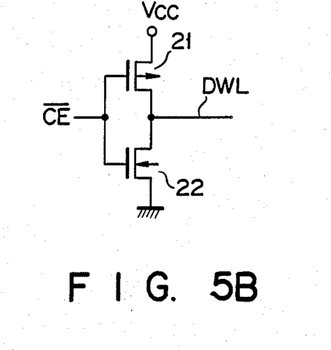

A bias circuit of FIG. 5B also comprises P channel MOSFET 21 and N channel MOSFET 22 connected in series between power source potential Vcc and ground. The circuit arrangement of this bias circuit is also substantially equivalent to the buffer circuit (not shown) in row decoder 11 (FIG. 3). The gates of these MOSFETs 21 and 22 are interconnected. The inverted chip enable signal $\overline{CE}$ is supplied to the gates of these MOSFETs 21 and 22. When the inverted chip enable signal $\overline{CE}$ is in a logic "0", MOSFET 21 is turned on and dummy row line DWL in a logic "1". The interconnection of MOSFETs 21 and 22 is connected to dummy row line DWL.

Figure 5C:
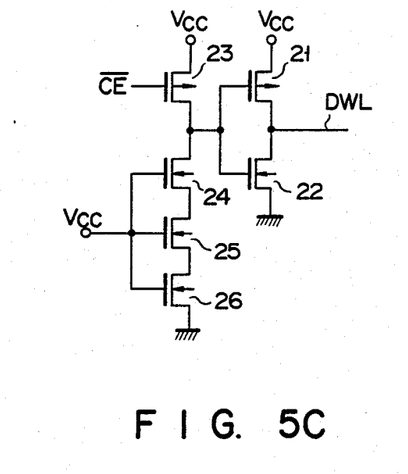

A bias circuit of FIG. 5C comprises a circuit substantially equivalent to the buffer circuit (not shown) in the row decoder 11 of FIG. 3. The bias circuit further comprises a circuit substantially equivalent to a decoder circuit (not shown) in the row decoder 11, which receives and decodes address signals. The bufferequivalent circuit comprises P channel MOSFET 21 and N channel MOSFET 22 whose source-drain paths are connected in series between power source potential Vcc and ground. The decoder-equivalent circuit comprises P channel MOSFET 23 and N channel MOSFETs 24 to 26, whose sourcedrain paths are connected in series between power source potential Vcc and ground. The gate of MOSFET 23 is supplied with the inverted chip enable signal $\overline{CE}$. The gates of N channel MOSFETs 24 to 26 are supplied with power source potential Vcc. The interconnection of MOSFETs 23 and 24 is connected to the gates of MOSFETs 21 and 22. The interconnection of MOSFETs 21 and 22 is connected to dummy row line DWL.

Figure 5D:
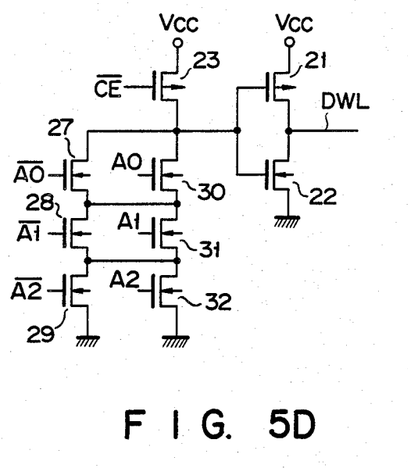

A bias circuit of FIG. 5D comprises a circuit substantially equivalent to the buffer circuit (not shown) in the row decoder 11 of FIG. 3. The bias circuit further comprises a circuit substantially equivalent to a decoder circuit (not shown) in the row decoder 11, which receives and decodes address signals. The buffer-equivalent circuit comprises P channel MOSFET 21 and N channel MOSFET 22 whose source-drain paths are connected in series between power source potential Vcc and ground. The decoder-equivalent circuit comprises P channel MOSFET 23 and N channel MOSFETs 27 to 32. Source-drain paths of MOSFETs 23 and 27 to 29 are connected in series between power source potential Vcc and ground. Source-drain paths MOSFETs 23 and 30 to 32 are connected in series between power source potential Vcc and ground. The gate of MOSFET 23 is supplied with the inverted chip enable signal $\overline{CE}$. The interconnection of MOSFETs 23, 27 and 30 is connected to the gates of MOSFETs 21 and 22. The interconnection of MOSFETs 21 and 22 is connected to dummy row line DWL. The interconnection of MOSFETs 27 and 28 is connected to the interconnection of MOSFETs 30 and 31. The interconnection of MOSFETs 28 and 29 is connected to MOSFETs 31 and 32. The gates of MOSFETs 27, 28, and 29 are supplied with address signals A0, A1, and A2, and respectively. The gates of MOSFETs 30, 31, and 32 are supplied with the complementary address signals A0, A1, and A2, respectively.

Figure 6:
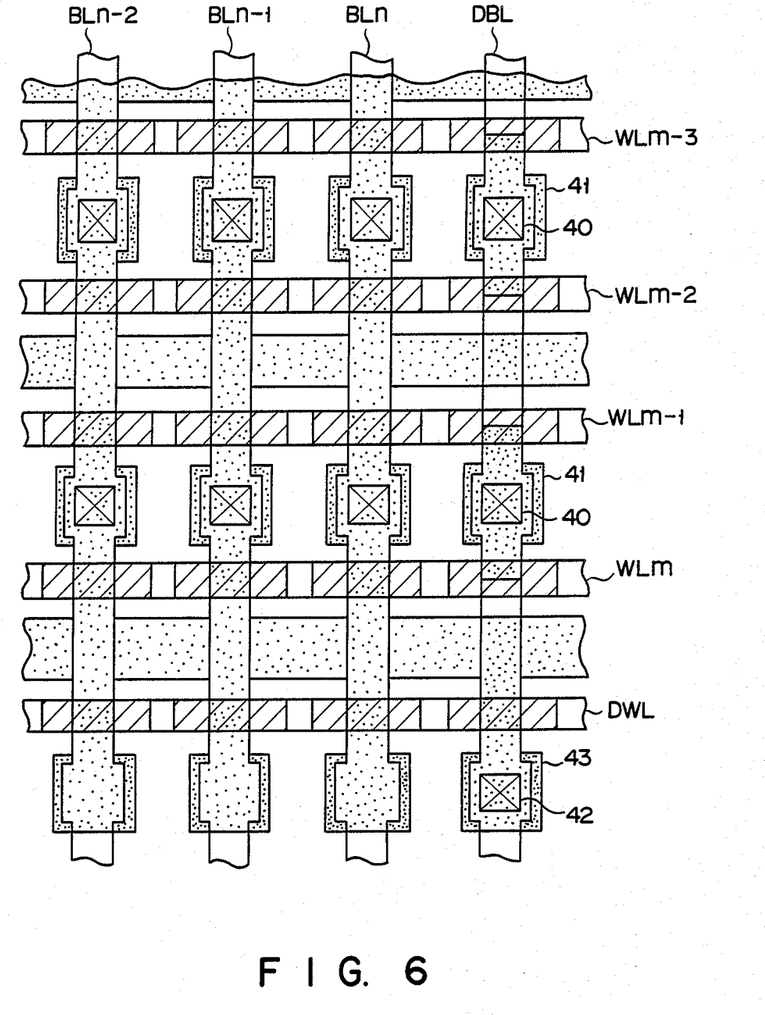
FIG. 6 shows a plan view of memory cell array 16 of the semiconductor memory device shown in FIG. 3.

Turning now to FIG. 6, there is shown a top view of memory cell array 16. Dummy column line DBL is a metal layer made of, for example, aluminum, which is adjacent to normal column line BLn. The dummy column line DBL is connected to drain region 41 of dummy memory cells DC (generally designates DC1, DC2, ..., DCm), via contact holes 40. Dummy column line DBL is also connected to drain region 43 of dummy memory cell DDC, via contact hole 42.

Dummy row line DWL is a polysilicon layer and adjacent to normal row line WLm. The polysilicon layer is further used as the control gate electrodes of dummy memory cells DDC and DMC, and connects the control gate of dummy memory cells DDC and DMC.

In this way, dummy column line DBL and dummy row line DWL are provided in memory cell array 16. Accordingly normal row lines WL and dummy row line DWL are equally influenced by external noise, and normal column lines BL and dummy column line DBL are equally influenced by external noise. Dummy cell DC has not source region. The channel region of dummy cell DC terminates at a predetermined distance from the drain thereof as shown in FIG. 6. In FIG. 6, the hatched portions indicate polysilicon layers serving as the floating gates of MOSFETs.

It should be understood that this invention is not limited to the above specific embodiment, but may variously be changed and modified within the scope of this invention. For example, this invention can be applied to a mask ROM.

Though, in the above-mentioned embodiment, dummy row line DWL is adjacent to the normal memory cell array, it may be far from and independent of the normal memory array cell. Furthermore, the normal row line WL and dummy row line DWL need not have exactly the same construction, if these row lines are operable within a tolerable noise level.

Figure 7:
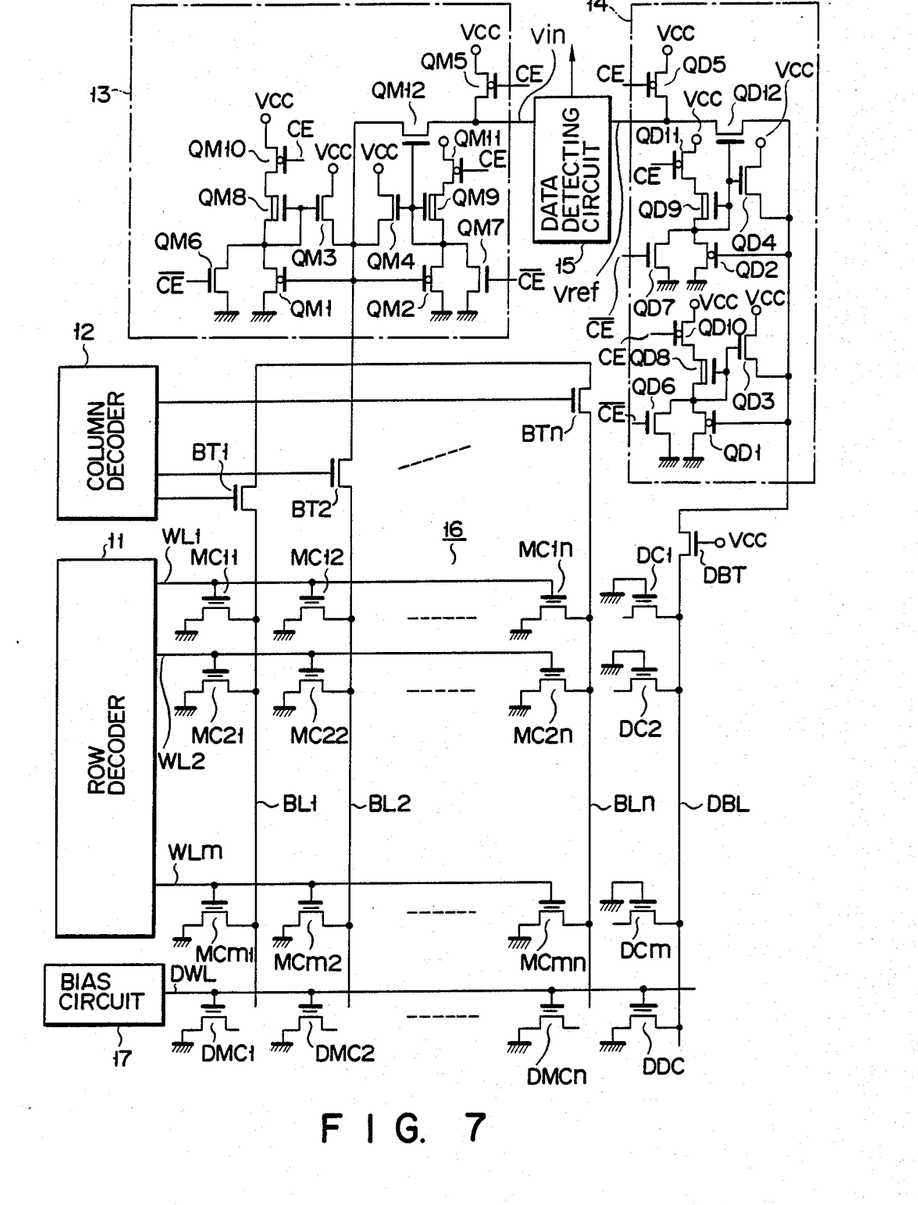
FIG. 7 shows a circuit diagram of a semiconductor memory device according to another embodiment of the invention.
Figure 8:
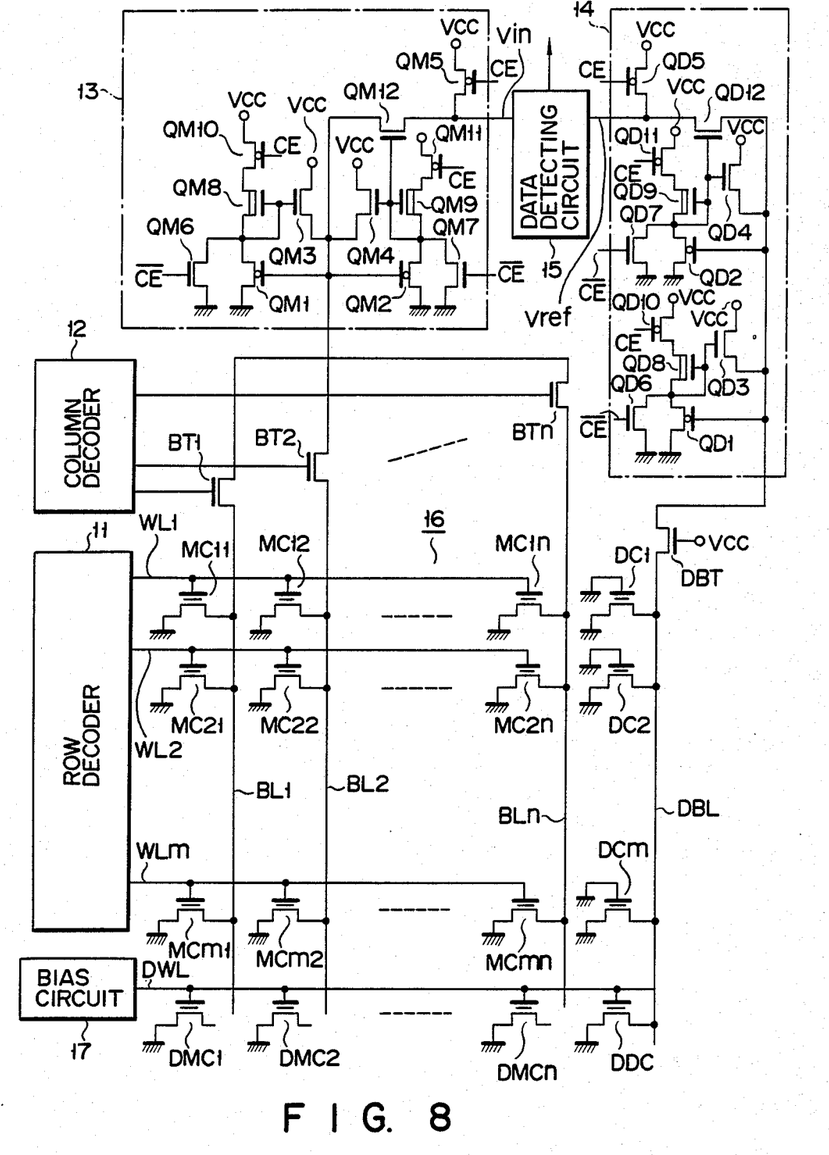
FIG. 8 shows a circuit diagram of a semiconductor memory device according to a further embodiment of the invention.

Furthermore, in the above embodiment, the gate of dummy memory cell DC is connected to one of normal column lines WL. However, as shown in FIG. 7, the gate of dummy memory cell DC can be connected to any predetermined potential (for example, the ground potential) which can normally render dummy memory cell DC nonconductive. In this case, the source of the MOSFET of dummy memory cell DC may be floating in potential, as shown in FIG. 7, or may be connected to a predetermined potential, for example, the ground potential, as shown in FIG. 8.

Figure 9:
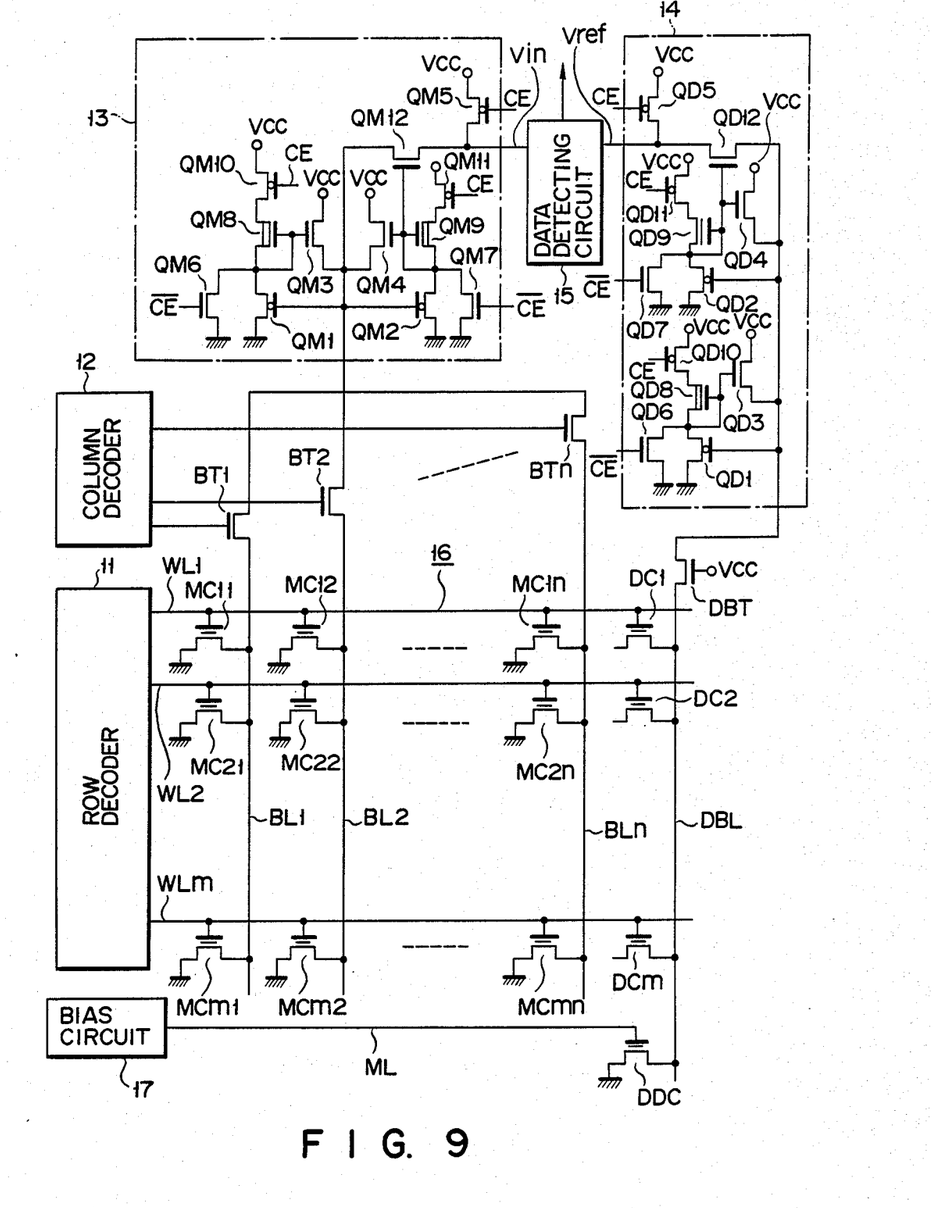
FIG. 9 shows a circuit diagram of a semiconductor memory device according to a still another embodiment of the invention.
Figure 10:
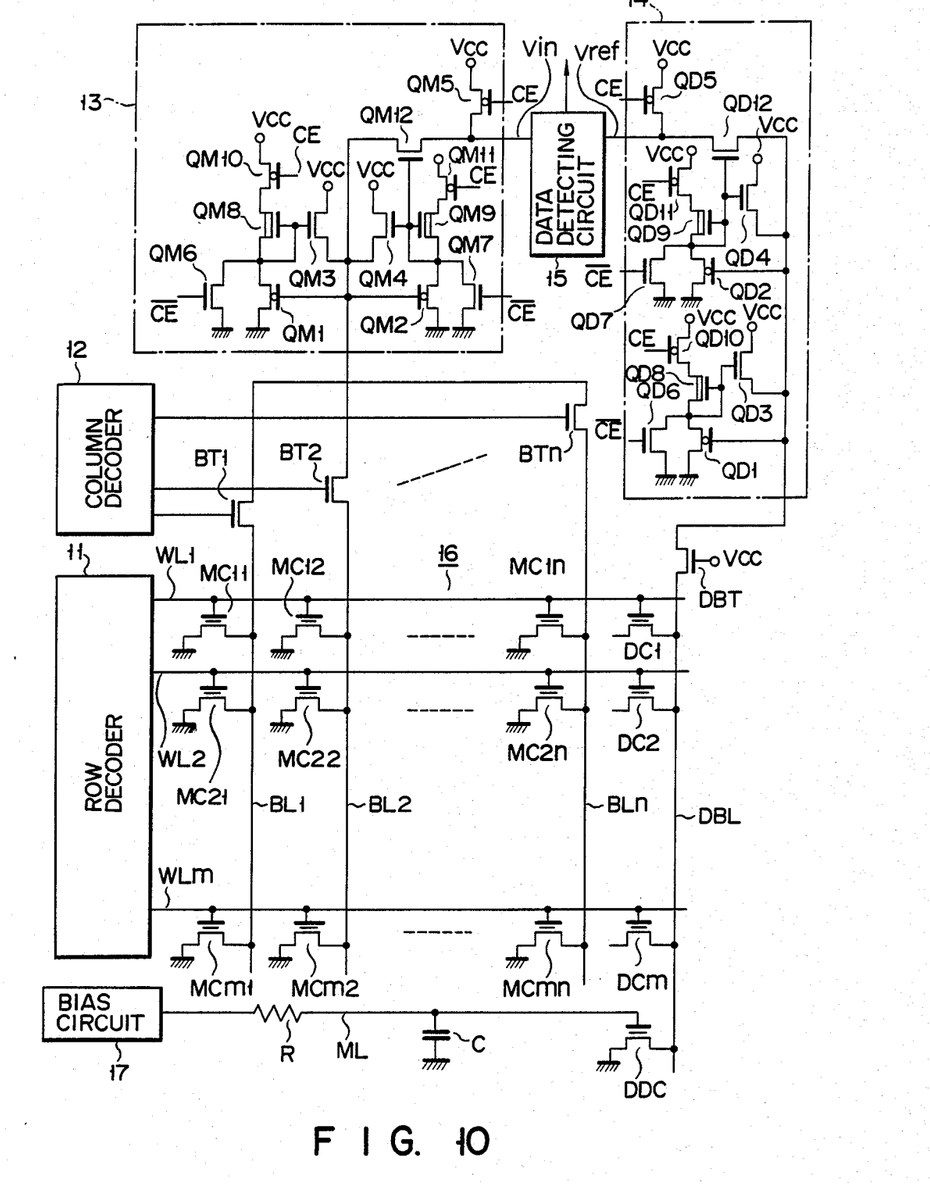
FIG. 10 shows a circuit diagram of a semiconductor memory device according to a yet further embodiment of the invention.

Furthermore, in the above embodiment, dummy memory cells DMC and DDC are connected to dummy row line DWL. However, if a small difference of the characteristics between normal row line WL and dummy row line DWL can be allowed for the operation of the device, dummy memory cells DMC need not be provided, and dummy row line DWL can be replaced with metal line ML, for example, an aluminum line, to which dummy memory cell DDC is connected, as shown in FIG. 9. Alternatively, as shown in FIG. 10, dummy memory cell DDC may be connected to the bias circuit 17 through resistor R, and one end of capacitor C may be connected to this connecting point of dummy memory cell DDC and register R. The other end of capacitor C is connected to the ground. Resistance of resistor R is substantially identical to that of normal row line WL. Capacitance of capacitor C is substantially identical to that of dummy memory cell DMC.

As will be understood from the above, according to the present invention, a fixed potential is always supplied to the dummy row line from the bias circuit, so that the reference potential as generated by the second load circuit is kept unchanged. Therefore, the data detecting operation is stable against noise, even when the row lines are switched. Consequently, the semiconductor memory device according to this invention can correctly detect data.

What is claimed is:
1. A semiconductor memory device comprising:
a row decoder;
a column decoder;
normal row lines, one of the normal row lines being enabled in at least a data-read mode, which is selected by said row decoder;
normal memory cells driven by said normal row lines;
normal column lines for receiving the data read out from said memory cells;
a first load circuit connected to said normal column lines, for generating a potential corresponding to the data read out to said memory cell;
a dummy row line;
bias means for applying a bias potential to said dummy row line in at least the data-read mode to enable the dummy row line;
a dummy column line;
first dummy memory cells each comprised of a MOSFET whose drain is connected to said dummy column line, a path connecting the drain and the source of the MOSFET forming an opened circuit; and
a second dummy memory cell comprised of a MOSFET whose drain and gate are connected to said dummy column line and said dummy row line, respectively, the MOSFET being turned on when said bias potential is applied to said dummy row line.

2. A semiconductor memory device according to claim 1, in which said MOSFET of each of the first dummy memory cells is substantially identical to said MOSFET of each of the normal memory cells.

3. A semiconductor memory device according to claim 1, in which said MOSFET of the second dummy memory cell is substantially identical to said MOSFET of each of the normal memory cells.

4. A semiconductor memory device according to claim 1, in which each of third dummy memory cells comprises a MOSFET whose gate are connected to said dummy row line, and said MOSFET of each of the third dummy memory cells is substantially identical to said MOSFET of each of the normal memory cells.

5. A semiconductor memory device according to claim 1, in which the gate of said MOSFET of each of the first dummy memory cells is connected to corresponding one of said normal row lines.

6. A semiconductor memory device according to claim 1, in which said MOSFET of each of the first dummy memory cells does not comprise a source region, and the gate of said MOSFET of each of the first dummy memory cells is connected to corresponding one of said normal row lines.

7. A semiconductor memory device according to claim 1, in which the gate of said MOSFET of each of the first dummy memory cells is connected to a predetermined potential.

8. A semiconductor memory device according to claim 7, in which said predetermined potential is the ground potential.

9. A semiconductor memory device according to claim 1, in which said MOSFET of each of the first dummy memory cells does not comprise a source region, and the gate of said MOSFET of each of the first dummy memory cells is connected to a predetermined potential.

10. A semiconductor memory device according to claim 9, in which said predetermined potential is the ground potential.

11. A semiconductor memory device according to claim 1, in which the source of said MOSFET of each of the first dummy memory cells is connected to a first predetermined potential, and the gate of said MOSFET of each of the first dummy memory cells is connected to a second predetermined potential.

12. A semiconductor memory device according to claim 11, in which said first and second predetermined potentials are the ground potential.

13. A semiconductor memory device according to claim 1, wherein the source of said MOSFET of the second dummy memory cell is connected to a predetermined potential.

14. A semiconductor memory device according to claim 13, further comprising third dummy memory cells each comprised of a MOSFET whose gate is connected to said dummy row line.

15. A semiconductor memory device according to claim 14, in which the source of said MOSFET of each of the third dummy cells is connected to the ground.

16. A semiconductor memory device according to claim 1, in which said dummy row line is a metal line, and the source of said MOSFET of the second dummy memory cell is connected to a predetermined potential 17. A semiconductor memory device according to claim 16, in which said predetermined potential is the ground potential.

18. A semiconductor memory device according to claim 1, in which the source of said MOSFET of the second dummy memory cell is connected to a predetermined potential, said semiconductor memory device further comprises a resistor means and a capacitor means, said dummy row line includes said resistor means, one end of said resistor means is connected to said bias means the other end of said resistor means is connected to the gate of said second dummy memory cell, and said capacitor means is connected between said other end and said predetermined potential.

19. A semiconductor memory device according to claim 18, in which said predetermined potential is the ground potential.

20. A semiconductor memory device according to claim 1, in which said bias potential is a predetermined potential.

21. A semiconductor memory device according to claim 1, in which said bias potential is a power source potential which is applied to this semiconductor memory device.

22. A semiconductor memory device according to claim 1, in which said bias means comprises a MOSFET of a first channel type and a MOSFET of a second channel type connected in series between a first power source potential and a second power source potential, the gates of said MOSFETs are connected to said second power source potential, and the interconnection of said MOSFETs are connected to said dummy row line.

23. A semiconductor memory device according to claim 1, in which said bias means comprises a MOSFET of a first channel type and a MOSFET of a second channel type connected in series between a first power source potential and a second power source potential, the gates of said MOSFETs are connected to a control signal, and the interconnection of said MOSFETs are connected to said dummy row line.

24. A semiconductor memory device according to claim 1, in which said bias means comprises first MOSFET of a first channel type and second MOSFET of a second channel type connected in series between a first power source potential and a second power source potential, third MOSFET of said first channel type whose gate is connected to a control signal, said third MOSFET is connected between said first power source potential and gates of said first and second MOSFETs, and a MOSFET circuit of said second channel type is connected between said gates of said first and second MOSFETs and said second power source potential.

25. A semiconductor memory device according to claim 24, in which said MOSFET circuit comprises at least two MOSFETs of said second channel type, the drains of said two MOSFETs are connected to said gates of said first and second MOSFETs, the sources of said two MOSFETs are connected to said second power source potential, the gate of one of said two MOSFETs is applied with a logic signal, the gate of the other MOSFET of said two MOSFETs is applied with a complementary logic signal of said logic signal.

26. A semiconductor memory device according to claim 1, in which the source of said MOSFET of each of the first dummy memory cells is floating in potential.

27. A semiconductor memory device according to claim 14, in which the source of said MOSFET of each of the third dummy cells is connected to the ground, said MOSFET of each of the first dummy memory cells does not comprise a source region, and the gate of said MOSFET of each of the first dummy memory cells is connected to corresponding one of said normal row lines.

* * * * *